US012771246B2

(12) United States Patent
Yang et al.

(10) Patent No.: US 12,771,246 B2
(45) Date of Patent: Oct. 20, 2026

(54) DUTY-CYCLE AND STRAY CAPACITANCE INSENSITIVE SWITCHED-CAPACITOR CURRENT SOURCE

(71) Applicant: QUALCOMM Incorporated, San Diego, CA (US)

(72) Inventors: Chienchung Yang, San Diego, CA (US); Yuhua Guo, San Diego, CA (US); David Ta-hsiang Lin, San Diego, CA (US); Xiaopeng Zhong, Seattle, WA (US); Chieh-Yu Hsieh, Irvine, CA (US); Daniel Kang, San Diego, CA (US)

(73) Assignee: QUALCOMM Incorproated, San Diego, CA (US)

( * ) Notice: Subject to any disclaimer, the term of this patent is extended or adjusted under 35 U.S.C. 154(b) by 227 days.

(21) Appl. No.: 18/425,188

(22) Filed: Jan. 29, 2024

(65) Prior Publication Data

US 2025/0246998 A1 Jul. 31, 2025

(51) Int. Cl.

| | |
|---|---|
| ***H03K 5/24*** | (2006.01) |
| ***H02M 3/07*** | (2006.01) |
| ***H03M 1/46*** | (2006.01) |
| ***H03M 3/00*** | (2006.01) |

(52) U.S. Cl.

CPC ................ *H02M 3/07* (2013.01); *H03K 5/24* (2013.01); *H03K 5/2472* (2013.01); *H03K 5/2481* (2013.01); *H03K 5/249* (2013.01); *H03M 1/462* (2013.01); *H03M 1/466* (2013.01); *H03M 3/464* (2013.01); *H03M 3/49* (2013.01)

(58) Field of Classification Search

CPC ............ H02M 3/07; H02M 3/00; H03M 3/49; H03M 1/466; H03M 1/462; H03M 3/464; H03K 5/24; H03K 5/249; H03K 5/2472; H03K 5/2481

See application file for complete search history.

(56) References Cited

U.S. PATENT DOCUMENTS

| | | | | |
|---|---|---|---|---|
| 10,263,514 | B1 * | 4/2019 | Aboueldahab .......... | H02M 3/07 |
| 2005/0140537 | A1 * | 6/2005 | Waltari ............... | H03M 1/1245 341/172 |
| 2005/0206546 | A1 * | 9/2005 | Luo ....................... | H03M 1/682 341/155 |
| 2013/0278453 | A1 * | 10/2013 | Steensgaard-Madsen .................. | H03M 1/201 341/110 |
| 2014/0176250 | A1 * | 6/2014 | Thomsen ............. | H03K 3/0231 331/143 |
| 2017/0085986 | A1 * | 3/2017 | Tang ...................... | H04R 3/007 |
| 2018/0183456 | A1 * | 6/2018 | Lee ....................... | H03M 1/442 |
| 2025/0015811 | A1 * | 1/2025 | Zhou ..................... | H03M 1/468 |
| 2025/0266763 | A1 * | 8/2025 | Routledge ........... | H02M 1/0022 |

* cited by examiner

*Primary Examiner* — Crystal L Hammond
*Assistant Examiner* — Jonathan Walter Soileau
(74) *Attorney, Agent, or Firm* — QUALCOMM Incorporated

(57) ABSTRACT

A duty-cycle-insensitive current source includes a first switched-capacitor resistor and a second switched-capacitor resistor. During a first clock phase of a clock signal, the duty-cycle-insensitive current source charges a first capacitor in first switched-capacitor resistor to a reference voltage. During a second clock phase of the clock signal, the duty-cycle-insensitive current source charges a second capacitor in the first switched-capacitor resistor to the reference voltage.

22 Claims, 9 Drawing Sheets

DUTY-CYCLE AND STRAY CAPACITANCE INSENSITIVE SWITCHED-CAPACITOR CURRENT SOURCE

TECHNICAL FIELD

The present application relates generally to switched-capacitor circuits, and more specifically to a duty-cycle-insensitive and stray-capacitance-insensitive switch-capacitor current source.

BACKGROUND

A current source may be formed by applying a reference voltage across a resistor. By Ohm's law, the resistor will conduct a current that equals the reference voltage divided by a resistance of the resistor. However, the ratio of resistances between a pair of resistors in a modern semiconductor process is subject to substantial variation. In contrast, the ratio of the capacitances between a pair of capacitors is subject to considerably less variation. A more robust alternative is thus to replace the resistor with a switched-capacitor circuit in which a capacitor is alternatively charged to the reference voltage and then discharged. The amount of charge it takes to charge the capacitor is proportional to a product of a capacitance of the capacitor and the reference voltage. Suppose that the discharging and charging of the capacitor is subject to a clock signal having a fifty-fifty duty cycle. In one half period of the clock signal the capacitor is charged and then discharged in a subsequent half period. Given this clocking, it can be shown that the current conducted by the switched capacitor circuit is proportional to a product of the reference voltage, the capacitance of the capacitor, and one-half of the switching frequency. The capacitor and the associated switches thus act as a switched-capacitor resistor having a resistance that is proportional to a reciprocal of a product of the capacitance and the switching frequency.

SUMMARY

In accordance with an aspect of the disclosure, a switched-capacitor current source is provided that includes: a first transistor having a source coupled to a power supply node for a power supply voltage; a first switch coupled to a drain of the first transistor; a first switched-capacitor resistor including a first capacitor, the first switched-capacitor resistor being configured to couple a first plate of the first capacitor to the first switch during a charging clock phase of a first clock signal; a second switch coupled to the drain of the first transistor; and a second switched-capacitor resistor including a second capacitor, the second switched-capacitor resistor being configured to couple a first plate of the second capacitor to the second switch during a charging clock phase of a second clock signal.

In accordance with another aspect of the disclosure, a method of sourcing a current from a switched-capacitor current source is provided that includes: sourcing the current from a common node to charge a first capacitor in a first switched-capacitor resistor to a reference voltage during a first phase of a clock signal; and sourcing the current from the common node to charge a second capacitor in a second switched-capacitor resistor to the reference voltage during a second phase of the clock signal.

Finally, in accordance with yet another aspect of the disclosure, a switched-capacitor current source is provided that includes: a first switched-capacitor resistor including a first capacitor having a top plate configured to be charged to a first reference voltage during a charging clock phase of a first clock signal; a first shielding line adjacent the top plate of the first capacitor; a differential amplifier; a first switch coupled between the first shielding line and an output terminal of the differential amplifier; and a second switch coupled between the first shielding line and ground.

These and other advantageous features may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

Figure 1:
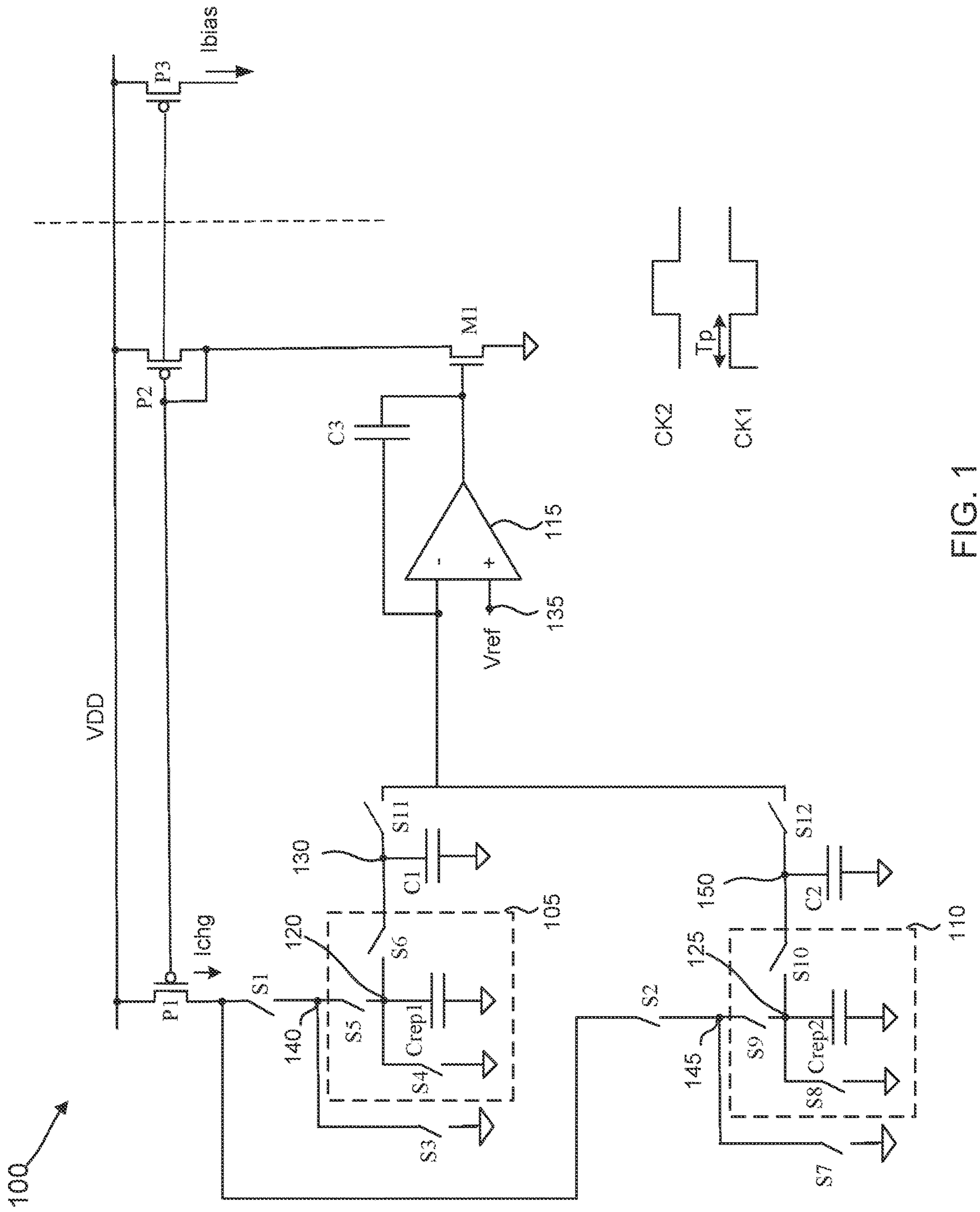
FIG. 1 is a diagram of an example duty-cycle-insensitive switched-capacitor current source in accordance with an aspect of the disclosure.

The capacitor in a switched-capacitor current source may be charged and discharged responsive to a clock signal. During a first phase of the clock signal, the capacitor is charged to a reference voltage and then discharged during a complementary phase of the clock signal. It can be shown that the charging current (and thus the current conducted by the switched-capacitor current source) is linearly proportional to the duty cycle of the first phase of the clock signal. In the following discussion, it will be assumed that this first phase occurs when the clock signal is charged to a supply voltage whereas the complementary phase occurs when the clock signal is discharged but it will be appreciated that this convention may be reversed in alternative implementations. But note that the duty cycle of a clock signal is subject to duty cycle variation. In one implementation, the duty cycle variation from one clock source to another may be as large as from 45% to 55%. The resulting current from the switched-capacitor current source will thus vary accordingly.

An advantageous duty-cycle-insensitive switched-capacitor current source is disclosed herein in which the duty cycle variation is eliminated by the inclusion of a pair of switched-capacitor resistors. A pair of clock signals controls the charging and discharging of the pair of switch-capacitor resistors. The clock signals are complementary such that when a first clock signal in the pair is asserted to a power supply voltage, a remaining second clock signal in the pair is discharged to ground. Similarly, when the second clock signal is asserted, the first clock signal is discharged. More generally, the first and second clock signals alternate between non-overlapping first and second complementary clock phases. When the first clock signal is in the first phase, the second clock signal is in the second phase. Conversely, when the first clock signal is in the second phase, the second clock signal is in the first phase.

The first clock signal controls when a first switched-capacitor resistor in the pair is charged. It is arbitrary what phase controls the charging cycle, but it will be assumed herein that it is the first phase in which the first clock signal is asserted to a power supply voltage. Thus, the first switched-capacitor resistor charges when the first clock signal is in the first phase and discharges when the first clock signal is in the second phase. Similarly, the second switched-capacitor resistor charges when the second clock signal is in the first phase and discharges when the second clock signal is in the second phase.

Note the advantages of the use of the pair of switched-capacitor resistors as clocked by the complementary first and second clock signals. As discussed earlier, a capacitor may be constructed relatively accurately such that the capacitance of the capacitor in the first switched-capacitor resistor will be substantially equal to the capacitance of the capacitor in the second switched-capacitor resistor. Each capacitor is charged to the reference voltage during the first phase of the respective clock signal. The current conducted by the first switched-capacitor resistor thus is proportional to a product of the reference voltage, the capacitance, and the duty cycle of the first clock signal. Similarly, the current conducted by the second switched-capacitor resistor is proportional to a product of the reference voltage, the capacitance, and the duty cycle of the second clock signal. The output current of the switched-capacitor circuit is a sum of these two currents. But the sum of the first duty cycle and the second duty cycle is always 100% (ignoring any error from the non-overlapping generation of the first and second clock signals, which is typically virtually negligible). The output current is thus proportional to a product of the reference voltage and the capacitance without any dependence on the duty cycle variation.

An example duty-cycle-insensitive switched-capacitor current source 100 is shown in FIG. 1 that includes a first switched-capacitor resistor 105 and a second switched-capacitor resistor 110. A current sourced by the duty-cycle-insensitive switched-capacitor current source 100 is denoted as a charging current (Ichg) since it charges a capacitor in the first and second switched-capacitor resistors 105 and 110. The following discussion will assume that this charging current is mirrored to bias a resistor-capacitor (RC) time constant of a continuous-time integration stage in an analog-to-digital converter (ADC). The charging current advantageously tracks a process, voltage, and temperature corner of the ADC as well as a clocking rate of the ADC. However, it will be appreciated that the charging current may be mirrored to drive other suitable circuits such as switched-capacitor circuit, a digital-to-analog converter (DAC), or a phase-locked loop (PLL) that may benefit from a bias and/or reference current that that tracks the process, voltage, and temperature corner and also tracks a clocking rate.

As will be explained further herein, the continuous-time integration stage includes an integration capacitor having a capacitance that forms the C in the RC time constant being biased by a mirrored version of the charging current from the duty-cycle-insensitive switched-capacitor current source 100. To properly bias the RC time constant, the first switched-capacitor resistor 105 includes a first replica capacitor (Crep1) having a capacitance that is proportional to a capacitance of the integration capacitor. A capacitance of the first replica capacitor is thus equal to $\alpha$*Cint, where $\alpha$ is a proportionality constant and Cint is the capacitance of the integration capacitor. Similarly, the second switched-capacitor resistor 110 includes a second replica capacitor (Crep2) having the same capacitance ($\alpha$*Cint) as the first replica capacitor.

The first and second switched-capacitor resistor 105 and 110 are clocked with respect to a first clock signal CK1 and a second clock signal CK2 that is complementary and non-overlapping with respect to the first clock signal CK1. During a first clock phase of the first clock signal CK1, the first clock signal CK1 is asserted to a power supply voltage VDD. The second clock signal CK2 is discharged during the first clock phase of the first clock signal CK1. During a first clock phase of the second clock signal CK2, the second clock signal CK2 is asserted to the power supply voltage VDD. The first clock signal CK1 is discharged during the first clock phase of the second clock signal CK2. The duration of the first clock signal CK1 assertion equals a pulse width Tp as shown separately in FIG. 1. The pulse width Tp also determines a duty cycle of the first clock signal CK1 that equals Tp divided by a period Ts of the first clock signal CK1 (note that Ts is also the period of the second clock signal CK2). A duty cycle of the second clock signal CK2 equals a duration of the first clock phase of the second clock signal CK2 divided by the clock period Ts. Ignoring the relatively minor effect of the non-overlapping of the clock signals, the duty cycle of the second clock signal thus equals 1−Tp/Ts.

In the following discussion, it will be assumed that the first replica capacitor in the first switched-capacitor resistor 105 is charged during the first clock phase of the first clock signal CK1. However, it will be appreciated that instead the second replica capacitor in the second switched-capacitor resistor 110 may be charged during the first clock phase of the first clock signal CK1 in alternative implementations. During the first clock phase of the first clock signal CK1, the first replica capacitor is charged to a reference voltage (Vref). The amount of charge to charge the first replica capacitor to the reference voltage is proportional to a product (($\alpha$*Cint)*Vref) of the capacitance ($\alpha$*Cint) of the first replica capacitor and the reference voltage. A resulting current conducted into the first replica capacitor during the first clock phase is thus proportional to a product ($\alpha$*Cint)*Vref*Tp/Ts. During the second clock phase of the first clock signal, the second replica capacitor is charged to the reference voltage. The amount of charge to charge the second replica capacitor to the reference voltage is thus also equal to ($\alpha$*Cint)*Vref. A resulting current conducted into the second replica capacitor during the second clock phase is thus proportional to a product ($\alpha$*Cint)*Vref)*(1−Tp/Ts).

As will be explained further herein, both the first replica capacitor and the second replica capacitor couple to a common node that conducts the charging current Ichg. The charging current Ichg is then a sum of the charging currents to the first and second replica capacitors and is thus proportional to (α*Cint)*Vref without any duty cycle variation. In the duty-cycle-insensitive switching-capacitor current source 100, the common node is a drain of a p-type metal-oxide semiconductor (PMOS) transistor P1 having a source coupled to a node for the power supply voltage VDD but it will be appreciated that other devices for forming the common node may be used in alternative implementations. Transistor P1 is also denoted herein as a first transistor. The drain of the transistor P1 couples through a first switch S1 to a node 140 and from node 140 to a switch S5 of the first switched-capacitor resistor 105. Switches S1 and S5 are controlled to close during the first phase of the first clock signal CK1. In the following discussion, if a switch is described to close during the first clock phase, it will be understood that such a switch will open during the second clock phase. Similarly, if a switch is described to close during the second clock phase, it will be understood to be open during the first clock phase. The first replica capacitor Crep1 couples between ground and a node 120 and from the node 120 to switch S5. With switches S1 and S5 closed during the first clock phase of the first clock signal CK1, the first replica capacitor Crep1 will charge to the reference voltage as discussed further herein.

Similarly, the drain of the transistor P1 couples through a second switch S2 to a node 145 and from node 145 to a switch S9 of the second switched-capacitor resistor 110. Switches S2 and S9 are controlled to close during the assertion of the second clock signal CK2, which corresponds to the second clock phase of the first clock signal CK1. The second replica capacitor Crep2 couples between ground and a node 125 and from the node 125 to the switch S9. With switches S2 and S9 closed during the assertion of the second clock signal CK2, the second replica capacitor Crep2 will charge to the reference voltage as discussed further herein.

To control the charging to the reference voltage of the first replica capacitor Crep1, node 120 couples to a node 130 through a switch S6 that closes during the assertion of the first clock signal CK1. Node 130 couples to a second input terminal (e.g. an inverting input terminal) of a differential amplifier 115 through a switch S11 that closes during the assertion of the second clock signal CK2. A first input terminal of the differential amplifier 115 (e.g., a non-inverting input terminal) couples to a node 135 for the reference voltage (Vref). Feedback through the differential amplifier 115 functions to keep the inverting input terminal charged to the reference voltage. The node 130 is thus also charged to the reference voltage during the second clock phase. To maintain this charging of the node 130 to the reference voltage, a holding capacitor C1 couples between ground and the node 130.

An output terminal of the differential amplifier 115 couples to a gate of an n-type metal-oxide semiconductor (NMOS) transistor M1 having a source coupled to ground. Transistor M1 is also denoted herein as a second transistor. A drain of the transistor M1 couples to a drain of a diode-connected transistor P2 having a source coupled to the power supply node for the power supply voltage VDD. A gate of transistor P2 couples to a gate of transistor P1 to form a current mirror. A current conducted by transistor M1 is thus a mirrored version of the charging current Ichg conducted by the transistor P1. To increase the stability of the differential amplifier 115, a coupling capacitor C3 couples between the output terminal of the differential amplifier 115 and its inverting input terminal. During the second clock phase of the first clock signal CK1, a switch S4 in the first switched-capacitor resistor 105 that couples between node 120 and ground closes to discharge the first replica capacitor Crep1. A switch S3 that couples between node 140 and ground also closes during the second clock phase to ground node 140.

To control the charging to the reference voltage of the second replica capacitor Crep2, node 125 couples to a node 150 through a switch S10 that closes during the assertion of the second clock signal CK2. Node 150 couples to the second input terminal (e.g. the inverting input terminal) of the differential amplifier 115 through a switch S12 that closes during the assertion of the first clock signal CK1. As noted earlier, feedback through the differential amplifier 115 functions to keep the inverting input terminal charged to the reference voltage. The node 150 is thus also charged to the reference voltage during the first clock phase. To maintain this charging of the node 150 to the reference voltage, a holding capacitor C2 couples between ground and the node 150. During the first clock phase of the first clock signal CK1, a switch S8 in the second switched-capacitor resistor 110 that couples between node 125 and ground closes to discharge the second replica capacitor Crep2. A switch S7 that couples between node 145 and ground also closes during the first clock phase to ground node 145.

Figure 2:
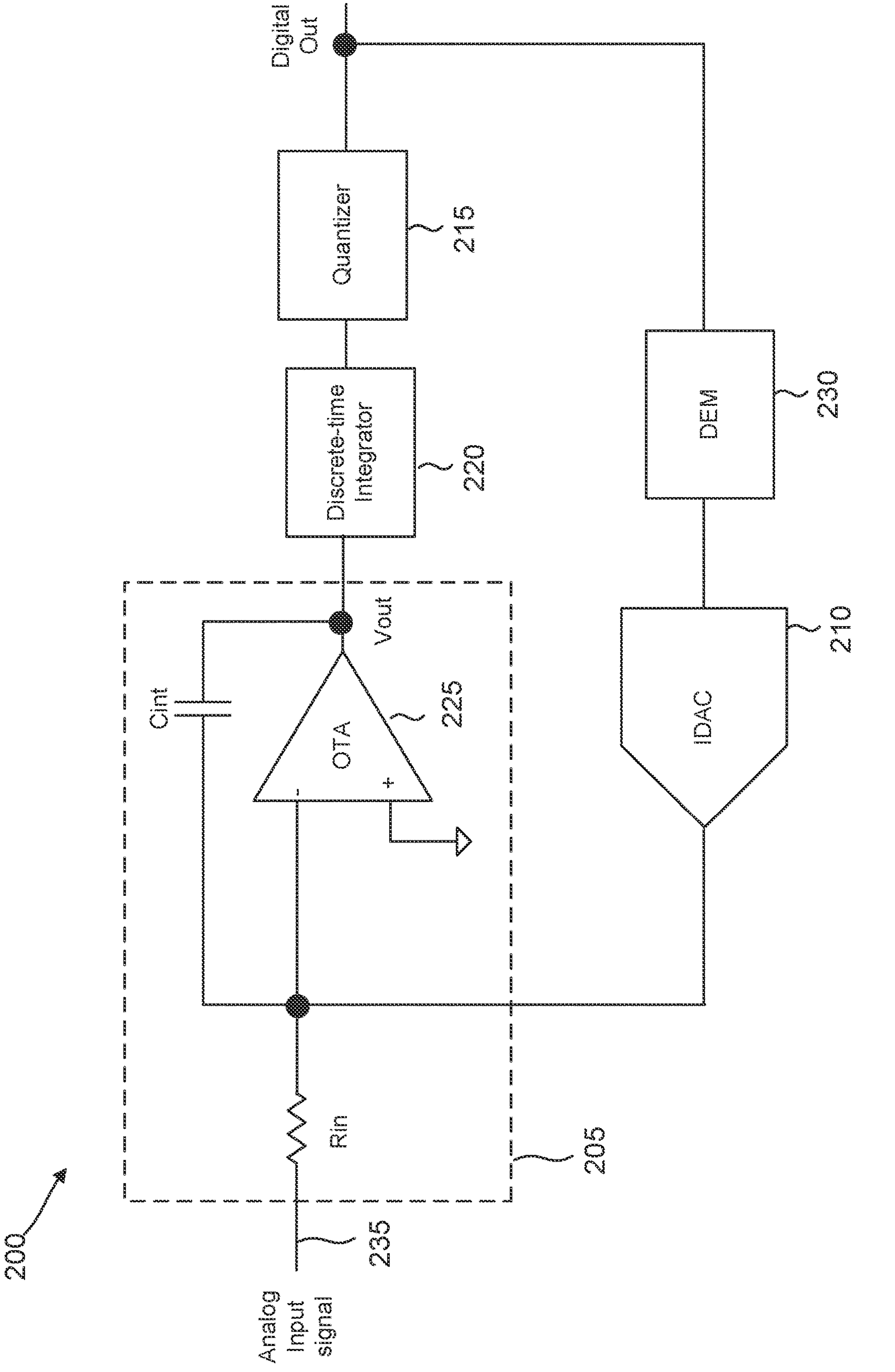
FIG. 2 is a diagram of an example analog-to-digital converter including a continuous-time integration stage having a time constant tuned responsive to a bias current from a duty-cycle-insensitive switched-capacitor current source in accordance with an aspect of the disclosure.

To provide an output current (for example, a bias current) to an external circuit (not illustrated), a gate of the transistor P2 may be coupled to a gate of an external PMOS transistor P3 having a source coupled to the power supply node for the power supply voltage VDD. Transistors P2 and P3 thus form a current mirror such that a bias current (Ibias) conducted by transistor P3 is proportional to (Vref*Cint). As noted earlier, an advantageous application of the bias current from the switched-capacitor current source 100 is to adjust the time constant of a continuous-time integration stage in an ADC. An example sigma-delta analog-to-digital converter 200 is shown in FIG. 2. A first integration stage 205 is a continuous-time integration stage that integrates according to a resistor-capacitor (RC) time constant. An input resistor Rin functions as the R in the RC time constant. An analog input signal being quantized (for example, an audio signal from a microphone) drives an input terminal 235 of the input resistor whereas another terminal of the input resistor couples to an inverting terminal of a differential amplifier such as an operational transconductance amplifier (OTA) 225. An integration capacitor (Cint) that functions as the C in the RC time constant couples between the inverting terminal of the OTA 225 and an output terminal of the OTA 225. The RC time constant thus equals Rin*Cint, where Rin is the resistance of the input resistor and Cint is the capacitance of the integration capacitor. A return-to-zero current digital-to-analog converter (IDAC) 210 also drives the inverting terminal of the OTA 225 with a feedback current that is pulsed according to the pulse width Tp that was discussed with respect to the first clock signal CK1). The pulse width Tp occurs within a cycle of an IDAC clock signal (not illustrated). An optional discrete-time integration stage 220 integrates an output voltage signal (Vout) from the first integration stage 205 to provide an integrated signal that is quantized by a quantizer 215 to provide a digital output signal. After processing by an optional dynamic element matching (DEM) function 230, the digital output signal feeds back through the IDAC 210 to the inverting node of the OTA 225.

It can be shown that the noise transfer function (NTF) of the sigma-delta ADC 200 is proportional to Rin*Cint/Tp and that the signal noise transfer function (STF) is proportional to Rin*IDAC, wherein IDAC is the IDAC output current. It is thus desirable to maintain both Rin*Cint/Tp and Rin*IDAC constant despite process, voltage, and temperature (PVT) variations. These factors should also scale with the clock frequency. The bias current from the switched-capacitor current source 100 advantageously provides this PVT tracking and clock scaling through a combination with an RC tuning circuit. In particular, an RC tuning circuit is disclosed in which the input resistor Rin is variable. The switched-capacitor current source 100 generates the bias current that biases the RC tuning circuit. The RC tuning circuit and switched-capacitor current source 100 disclosed herein are relatively low power and compact and increase the accuracy of the NTF and STF factors. In particular, the NTF is improved since it is no longer sensitive to variations of the pulse width Tp of the IDAC. Similarly, the STF is improved since its sensitivity to the variations of the pulse width Tp is substantially reduced. The RC tuning circuit in conjunction with the switched-capacitor current source 100 tune both the Rin*Cint/Tp and the Rin*IDAC factors discussed earlier. It will thus be appreciated that the sigma-delta ADC 200 is just one example of a sigma-delta ADC that includes an initial continuous-time integration stage and a return-to-zero IDAC that may be tuned as disclosed herein.

Figure 3:
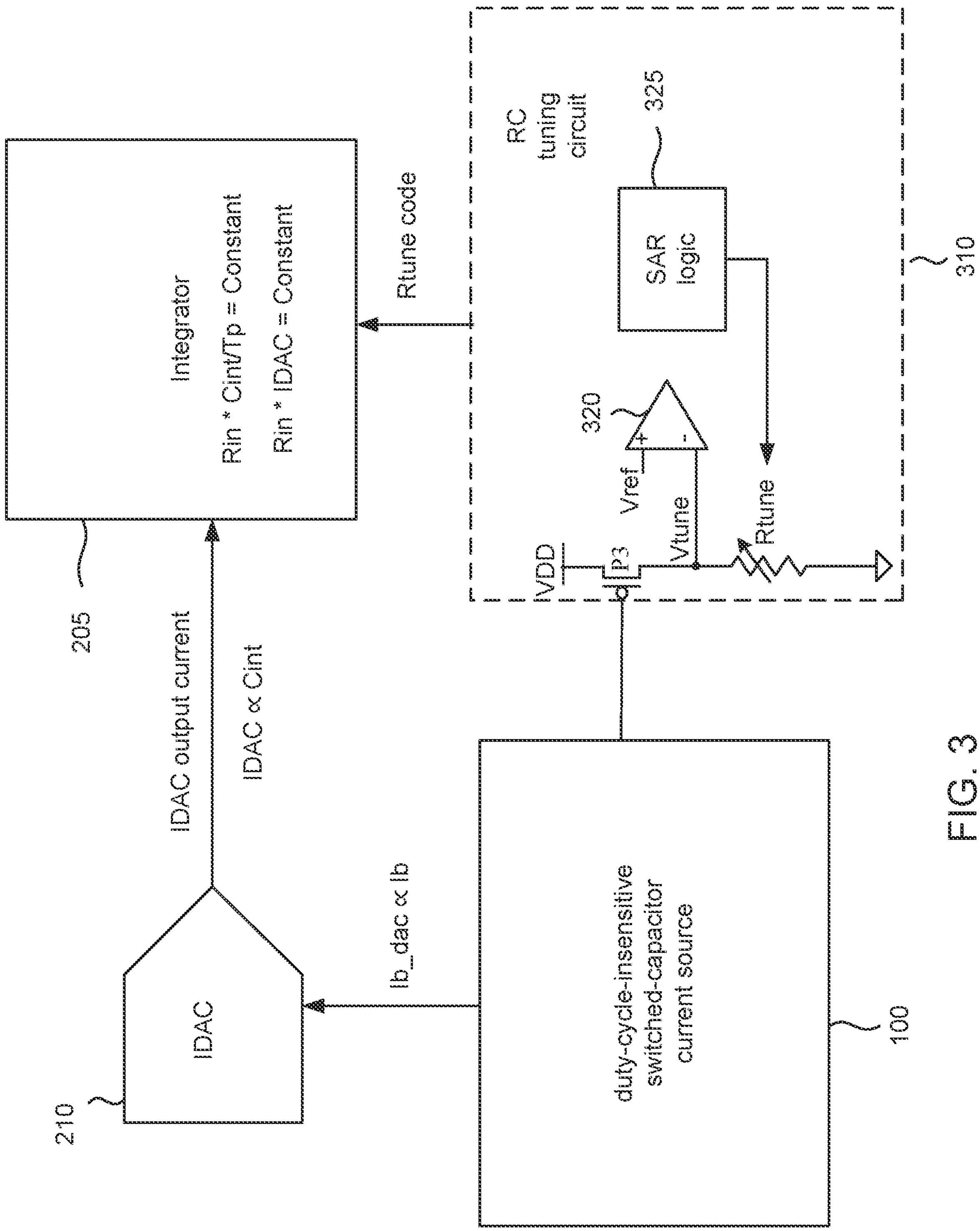
FIG. 3 is a circuit diagram of an example RC tuning circuit in combination with a duty-cycle-insensitive switched-capacitor current source for tuning an RC time constant of a continuous-time integration stage in accordance with an aspect of the disclosure.

A high-level diagram of the switched-capacitor current source 100, an RC tuning circuit 310, the IDAC 210, and the continuous-time integrator 205 are shown in FIG. 3. The RC tuning circuit 310 includes the transistor P3 that conducts the bias current as discussed with respect to FIG. 1. A drain of transistor P3 couples to ground through a variable tuning resistor (Rtune). The bias current as mirrored from the switched-capacitor current source 100 is proportional to a product of Vref and Cint. The bias current Ib develops a tuning voltage Vtune across the variable tuning resistor. A node for the tuning voltage couples to an inverting input terminal of a comparator 320 that also has its non-inverting input terminal coupled to a node for the reference voltage. A comparator output signal from the comparator 320 will thus have a binary state that depends upon whether the reference voltage is greater than or less than the tuning voltage. An output terminal of the comparator 320 couples to a SAR logic circuit 325 (which may be a finite state machine). Based upon the comparator output signal, the SAR logic circuit 325 performs a binary SAR-based resistance tuning on the tuning resistor by adjusting its resistance responsive to a digital tuning code until the tuning voltage is substantially equal to the reference voltage. An Rin tuning code (Rtune code) that adjusts a resistance of the variable input resistor (Rin) in the integrator 205 may be proportional to or equal to the digital tuning code for the tuning resistor depending upon the relative resistances of the input resistor and the tuning resistor.

The bias current Ib is also mirrored into an IDAC bias current (Ib_dac) that is proportional to the bias current. The IDAC 210 includes a plurality of current branches (not illustrated) that are active or inactive depending upon the digital output being converted by the IDAC 210. Each active current branch is biased to conduct the IDAC bias current. A combined current from the active branches forms an IDAC output current. Because the IDAC output current is pulsed with respect to the pulse width TP and the clocking period Ts, the IDAC output current is proportional to the bias current times a ratio of the pulse width Tp and the clocking period Ts. Given this tuning of the variable input resistor and the value of the IDAC output current, it can be shown that the factor Rin*Cint/Tp is advantageously maintained to substantially equal a constant across the process, voltage, and temperature corners for an ADC including the switched-capacitor current source 100, the IDAC 210, the integrator 205, and the RC tuning circuit 310. Similarly, the factor Rin*IDAC is also maintained to substantially equal a constant across the process, voltage, and temperature corners.

Figure 4:
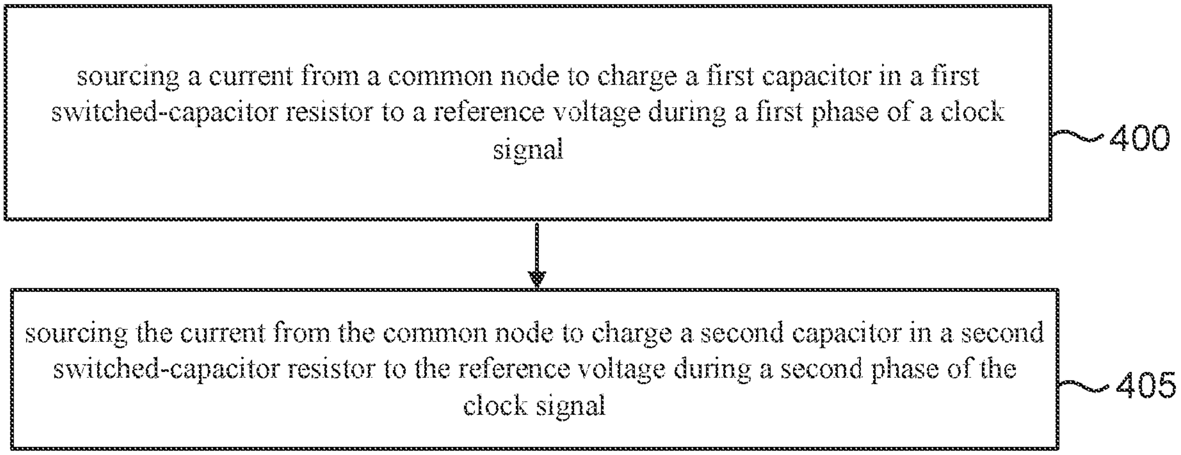
FIG. 4 is a flowchart of a method of sourcing a current from a duty-cycle-insensitive switched-capacitor current source in accordance with an aspect of the disclosure.

An example method of operation for a switched-capacitor current source will now be discussed with reference to the flowchart of FIG. 4. The method includes an act 400 of sourcing a current from a common node to charge a first capacitor in a first switched-capacitor resistor to a reference voltage during a first phase of a clock signal. The sourcing of the charging current from the drain of transistor P1 to charge the first replica capacitor in the switched-capacitor resistor 105 while the first clock signal CK1 is asserted is an example of act 400. The method also includes an act 405 of sourcing the current from the common node to charge a second capacitor in a second switched-capacitor resistor to the reference voltage during a second phase of the clock signal. The sourcing of the charging current from the drain of transistor P1 to charge the second replica capacitor in the switched-capacitor resistor 110 while the second clock signal CK2 is asserted is an example of act 405.

Figure 5:
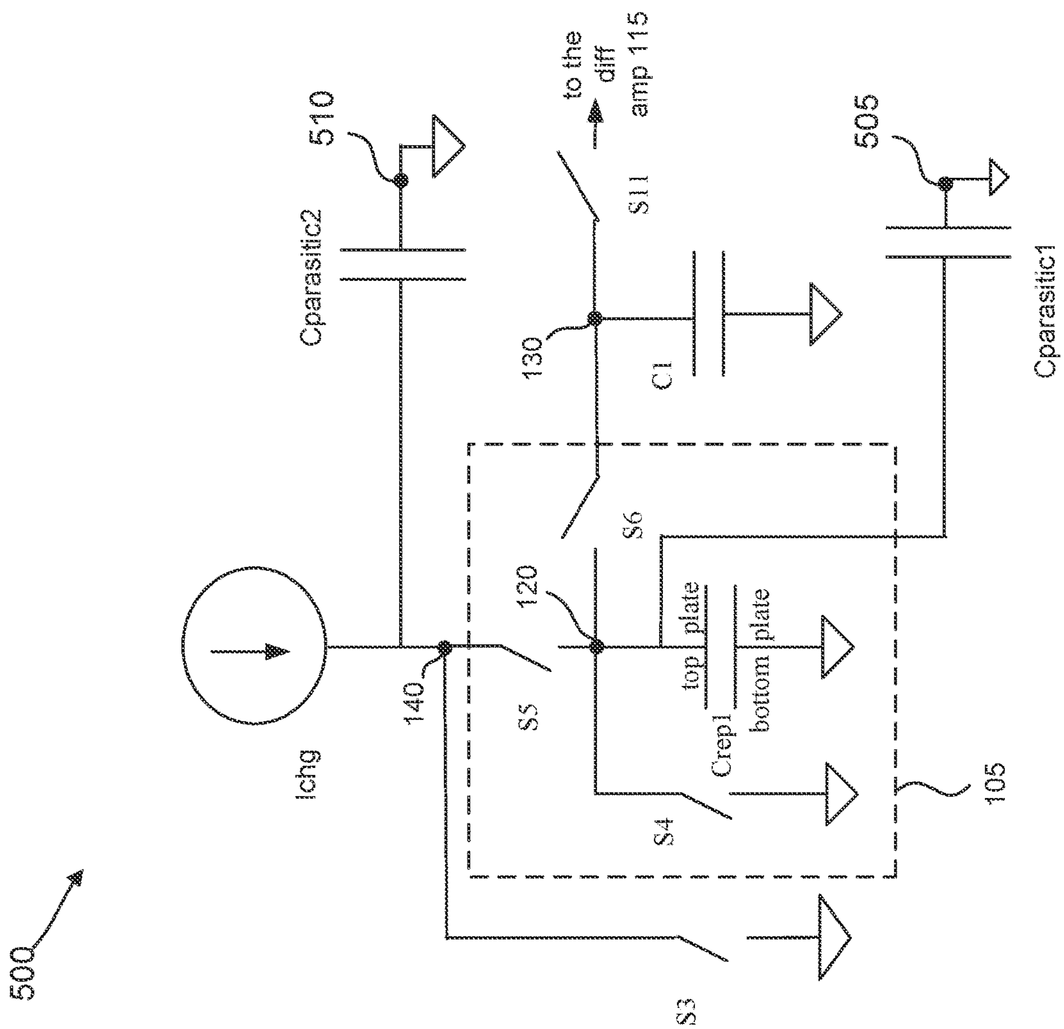
FIG. 5 illustrates some stray parasitic capacitances for a switched-capacitor current source.

Although the charging current from a duty-cycle-insensitive switched-capacitor current source as disclosed herein is advantageously insensitive to the duty cycle of the clock signals that clock the switched-capacitor resistors, note that the resulting bias current is dependent on the capacitance of the replica capacitors. For example, if the bias current is used to adjust the time constant of a continuous-time integration stage as discussed earlier, the capacitance of the replica capacitors should track the capacitance of the integration capacitor to maintain the ADC loop stability and performance. This problem of bias current accuracy will exist regardless of whether a switched-capacitor current source includes just a single switched-capacitor resistor or includes a pair as discussed for switched-capacitor current source 100. For example, consider a portion 500 of a switched-capacitor current source as shown in FIG. 5 that includes the switched-capacitor resistor 105. Switches S3, S4, S5, S6, and S11 are operated as discussed with respect to switched-capacitor current source 100. But note that a node 505 (e.g., a metal line routing) that is sufficiently adjacent to a top plate of the first replica capacitor (Crep1) may be either permanently or temporarily grounded. In contrast to the top plate, a bottom plate of the first replica capacitor directly couples to ground without any intervening switches. The top plate is also denoted herein as a first plate whereas the bottom plate is also denoted herein as a second plate.

While the charging current charges the first replica capacitor, there will then be a parasitic capacitance (Cparasitic1) from the top plate of the first replica capacitor to node 505 (assuming that node 505 is grounded during this charging period). A similar parasitic capacitance (Cparasitic2) exists between node 140 and a grounded node 510. The charging current should be linearly proportional to the capacitance of the first replica capacitor. But with the parasitic capacitors being arranged in parallel with the first replica capacitor, the charging current becomes linearly proportional to a total capacitance that equals a sum of the capacitance of the first replica capacitor and the parasitic capacitances. Depending upon the application, the charging current may then vary significantly from the desired linear proportionality to the capacitance of the first replica capacitor such as by 15%. The resulting inaccuracy in the charging current may not be acceptable to be mirrored into a suitable tracking current for an application such as a continuous-time integration stage.

This problem of bias current accuracy will exist regardless of whether a switched-capacitor current source includes just a single switched-capacitor resistor or includes a pair of switched-capacitor resistors as discussed for switched-capacitor current source 100. A stray-capacitance-insensitive switched-capacitor current source 600 shown in FIG. 6 advantageously maintains the desired linear proportionality for the charging current. A switched-capacitor resistor 605 is arranged analogously as discussed for the switched-capacitor resistors 105 and 110. For example, a switch S13, a switch S14, a switch S15, a switch S16, and a switch S17 are arranged analogously to switches S3, S4, S5, S6, and S11, respectively, as discussed for the switched-capacitor resistor 105. It is arbitrary whether a charging capacitor (Ccharging) in the switched-capacitor 105 is charged during the assertion of the first clock signal CK1 or during the assertion of the second clock signal CK2. The clock phase in which the charging capacitor is charged is thus denoted herein as a charging clock phase whereas the clock phase in which the charging capacitor is discharged is denoted as a discharging clock phase. Switches S15 and S16 thus close during the charging clock phase whereas switches S13, S14, and S17 close during the discharging clock phase. The charging capacitor functions as discussed with regard to the first and second replica capacitors in that the charging capacitor is charged to the reference voltage during the charging clock phase through the action of a differential amplifier feedback loop as represented by a current source Ichg.

To prevent the top plate of the charging capacitor from having a parasitic capacitive coupling to a grounded node such as node 505 discussed with respect to FIG. 5, the top plate of the charging capacitor is shielded by a shielding line 615. In that regard, the charging capacitor is formed through the patterning of metal layers that are positioned with respect to a semiconductor die that includes the active devices for the switched-capacitor current source. But the metal layers of such an integrated circuit are patterned into many leads for various signals, ground, and power. Shielding line 615 intervenes between the top metal plate for the charging capacitor and signal nodes that may be grounded (and/or permanent ground nodes) while the charging capacitor is charged. Similarly, a shielding line 610 intervenes between a node 625 and any signal nodes that may be grounded (and/or permanent ground nodes) while the charging capacitor is charged. Since shielding line 615 thus neighbors the top plate of the charging capacitor, a parasitic capacitance (Cparasitic1) may exist between the top plate and the shielding line 615. Similarly, a parasitic capacitance (Cparasitic2) may exist between the node 625 and the shielding line 610. But the effect of these parasitic capacitances on the charging current is effectively eliminated by charging the shielding lines 610 and 615 to a second reference voltage during the charging clock phase.

To charge the shielding lines, a biasing differential amplifier 620 receives the second reference voltage (Vref2) at a non-inverting input terminal. An inverting input terminal of the amplifier 620 couples to the output terminal of the amplifier 620. A capacitor C5 couples between the output terminal and ground. Feedback through the amplifier 620 will thus function to keep the capacitor C5 charged to the second reference voltage. In the following discussion, it will be assumed that the second reference voltage is the same as the reference voltage used to charge the replica capacitors in the switched-capacitor resistors (which may also be denoted as a first reference voltage herein). However, the second reference voltage may instead be equal to a settle-down voltage level for the top plate of the first replica capacitor should the settle-down voltage level not be equal to the first reference voltage. The output terminal of the amplifier 620 also couples through a switch S18 to the shielding lines 610 and 615 that is closed during the charging clock phase. In the stray-capacitance-insensitive switched-capacitor current source 600, the charging clock phase corresponds to the assertion of the first clock signal CK1 but it will be appreciated that the charging clock phase may instead correspond to the assertion of the second clock signal CK2. With the shielding lines 610 and 615 charged to the reference voltage as the charging capacitor and node 625 are also charged to the reference voltage, there is no charging of the parasitic capacitances. When the charging capacitor and node 625 are discharged during the discharging clock phase, a switch S19 closes that couples between the shielding lines 610 and 615 and ground. The shielding lines 610 and 615 are thus grounded while the top plate of the charging capacitor and node 625 are grounded, which again prevents any charging of the parasitic capacitances. In this fashion, the charging current is advantageously maintained with a linear proportionality to the capacitance of the charging capacitor. Switch S18 opens during the discharging clock phase whereas switch S19 opens during the charging clock phase.

Referring again to the duty-cycle-insensitive switched-capacitor current source 100, recall that the capacitance of the second replica capacitor should equal the capacitance of the first replica capacitor. More generally, the first replica capacitor may be denoted as a first capacitor and the second replica capacitor denoted as a second capacitor. Both of the first and second capacitors may be constructed from metal plates formed through the patterning of corresponding metal layers. To keep the capacitances as close as possible to each other, the metal plates for the first capacitor may be positioned next to the metal plates for the second capacitor. But this positioning of the first and second capacitors may then lead to an undesirable parasitic capacitive coupling between the respective top plates of the capacitors. In that regard, the phrase "top plate" of a capacitor as used herein refers to the capacitor plate that is charged to the reference voltage by the charging current.

Since the first capacitor is charged while the second capacitor is discharged, the top plate of the second capacitor may then capacitively couple as a ground node to the top plate of the first capacitor. Similarly, since the second capacitor is charged while the first capacitor is discharged, the top plate of the first capacitor may then capacitively couple as a ground node to the top plate of the second capacitor. The resulting parasitic capacitive coupling between the first and second capacitors may then negatively affect the desired proportionality of the charging current to the capacitance of the first and second capacitors.

Figure 7:
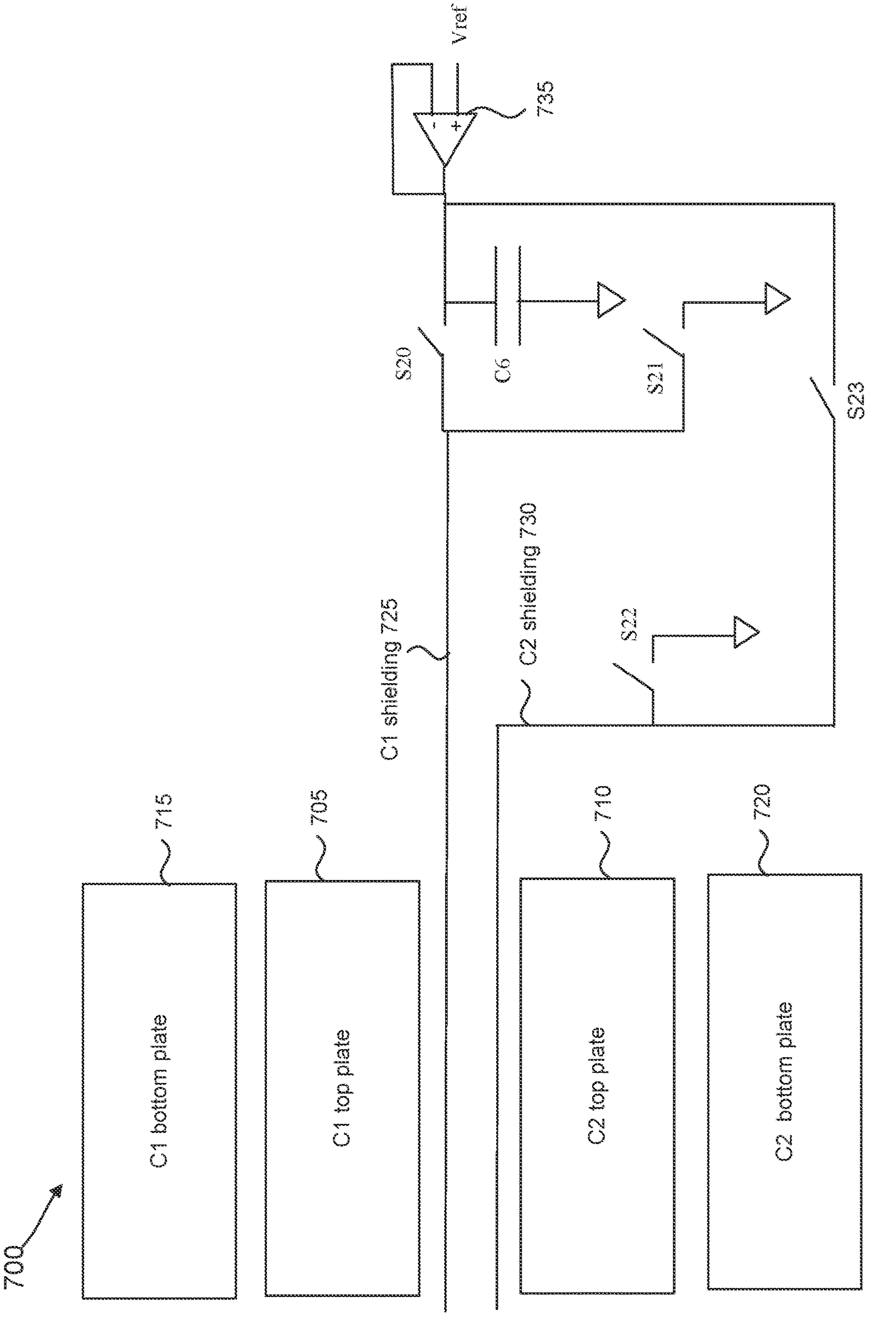
FIG. 7 illustrates a portion of a stray-capacitance-insensitive and duty-cycle-insensitive current source in accordance with an aspect of the disclosure.

A portion of a duty-cycle-insensitive switched capacitor current source 700 is shown in FIG. 7 that is advantageously free from a stray parasitic coupling between the a first capacitor C1 and a second capacitor C2. The first capacitor C1 is the equivalent of the first replica capacitor and is included in a first switched-capacitor resistor (not illustrated). The second capacitor C2 is the equivalent of the second replica capacitor and is included in a second switched-capacitor resistor (not illustrated). The first capacitor C1 and the second capacitor C2 are alternatively charged and discharged as analogously discussed for the duty-cycle-insensitive switched-capacitor current source 100. Both the first capacitor C1 and the second capacitor C2 are formed by patterning metal layers that neighbor a semiconductor substrate in which the active devices for the duty-cycle-insensitive switched-capacitor current source 700 are integrated.

To assist in achieving a matched capacitance between the first capacitor C1 and the second capacitor C2, the first capacitor C1 and the second capacitor C2 are positioned so as to neighbor each other. In particular, a C1 top plate 705 of the first capacitor C1 has an edge that faces an edge of a C2 top plate 710 of the second capacitor C2. With respect to unwanted stray capacitive coupling affecting the charging current, it is the C1 top plate 705 and the C2 top plate 710 that matter. In contrast, a C1 bottom plate 715 of the first capacitor C1 and a C2 bottom plate 720 of the second capacitor C2 are directly coupled to ground and will thus not have any unwanted capacitive coupling to any neighboring grounded nodes or signal leads. With respect to neighboring signal leads and ground nodes (not illustrated) to the C1 top plate 705, the C1 bottom plate 715 thus intervenes between the C1 top plate 705 and the neighboring signal leads and ground nodes. Similarly, the C2 bottom plate 720 intervenes between the C2 top plate 710 and any neighboring signal leads and ground nodes (not illustrated).

Although the C1 top plate 705 is effectively shielded by the corresponding C1 bottom plate 715 from surrounding signal leads and ground nodes, note that the C2 top plate 710 will be grounded while the C1 top plate 705 is being charged to the reference voltage. The C1 top plate 705 may thus have a parasitic coupling to the C2 top plate 710 while the first capacitor C1 is being charged. To thwart this coupling, a C1 shielding line 725 intervenes between the C1 top plate 705 and the C2 top plate 710.

The C1 shielding line 725 is charged to the reference voltage during the charging phase of the first capacitor C1 analogously as discussed for the shielding lines 610 and 615. To charge the C1 shielding line 725 to the reference voltage, a differential amplifier 735 receives the reference voltage (Vref) at a non-inverting input terminal. An inverting input terminal of the amplifier 735 couples to the output terminal of the amplifier 735. A capacitor C6 couples between the output terminal and ground. Feedback through the amplifier 735 will thus function to keep the capacitor C6 charged to the reference voltage. The output terminal of the amplifier 735 also couples through a switch S20 that is closed during the charging clock phase. In the duty-cycle-insensitive switched-capacitor current source 700, the charging clock phase of the first capacitor C1 corresponds to the assertion of the first clock signal CK1 but it will be appreciated that the charging clock phase may instead correspond to the assertion of the second clock signal CK2. During the charging clock phase of the first capacitor C1, the C2 top plate 710 is grounded. But with the C1 shielding line 725 being charged to the reference voltage as the C1 top plate 705 is also charged to the reference voltage, a capacitive coupling between the charged C1 top plate 705 and the grounded C2 top plate 710 is effectively prevented. When the first capacitor C1 is discharged during the discharging clock phase of the first capacitor C1, a switch S21 closes that couples between the C1 shielding line 725 and ground. The C1 shielding line 725 is thus grounded while the C1 top plate 705 is grounded, which again prevents a stray capacitive coupling to the C2 top plate 710, which is charged to the reference voltage during the discharging clock phase for the first capacitor C1.

During the discharging clock phase for the first capacitor C1 and the grounding of the C1 shielding line 725, the C2 top plate 710 is charged to the reference voltage. A stray capacitive coupling may occur between the C2 top plate 710 and the grounded C1 shielding line 725 and the grounded C1 top plate 705. A C2 shielding line 730 thus intervenes between the C1 shielding line 725 and the C2 top plate 710. A switch S23 that closes during the discharging clock phase for the first capacitor C1 couples between the output terminal of the differential amplifier 735 and the C2 shielding line 730 to charge the C2 shielding line 730 to the reference voltage. In this fashion, the charged C2 top plate 710 is effectively prevented from a stray capacitive coupling to the grounded C1 shielding line 725 and the grounded C1 top plate 705. During the charging clock phase for the first capacitor C1, the C2 top plate 710 is grounded and could thus have a stray capacitive coupling to the charged C1 top plate 705 and the charged C1 shielding line 725. A switch S22 that couples between the C2 shielding line 730 and ground is thus closed during the charging clock phase for the first capacitor C1 to ground the C2 shielding line 730 and shield the grounded C2 top plate 710 from the charged C1 top plate 705 and the charged C1 shielding line 725. Like the differential amplifier 620, the differential amplifier 730 may be a relatively compact and low power differential amplifier as both differential amplifiers merely drive the corresponding shielding lines.

Figure 6:
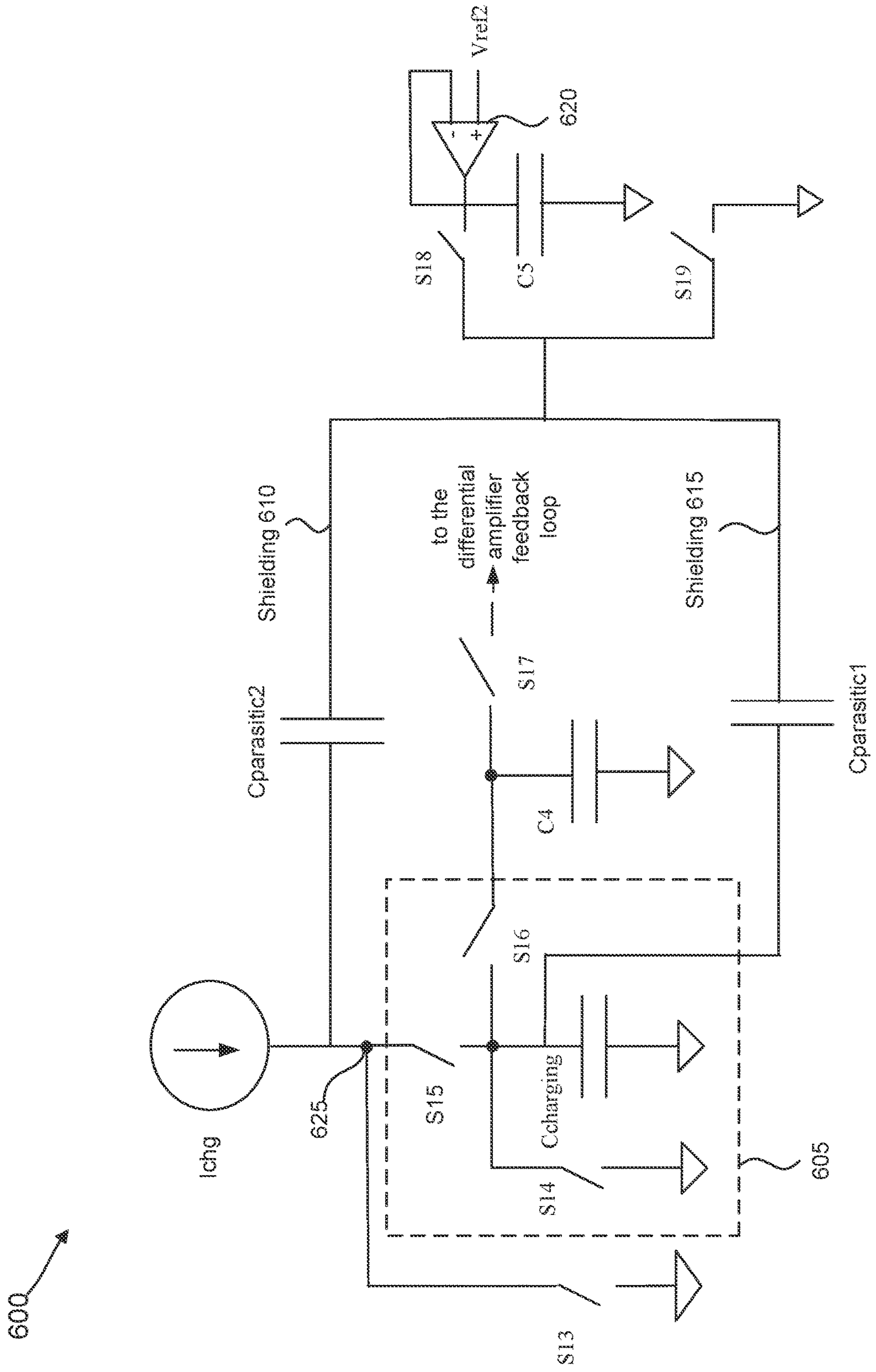
FIG. 6 illustrates a stray-capacitance-insensitive switched-capacitor current source in accordance with an aspect of the disclosure.
Figure 8:
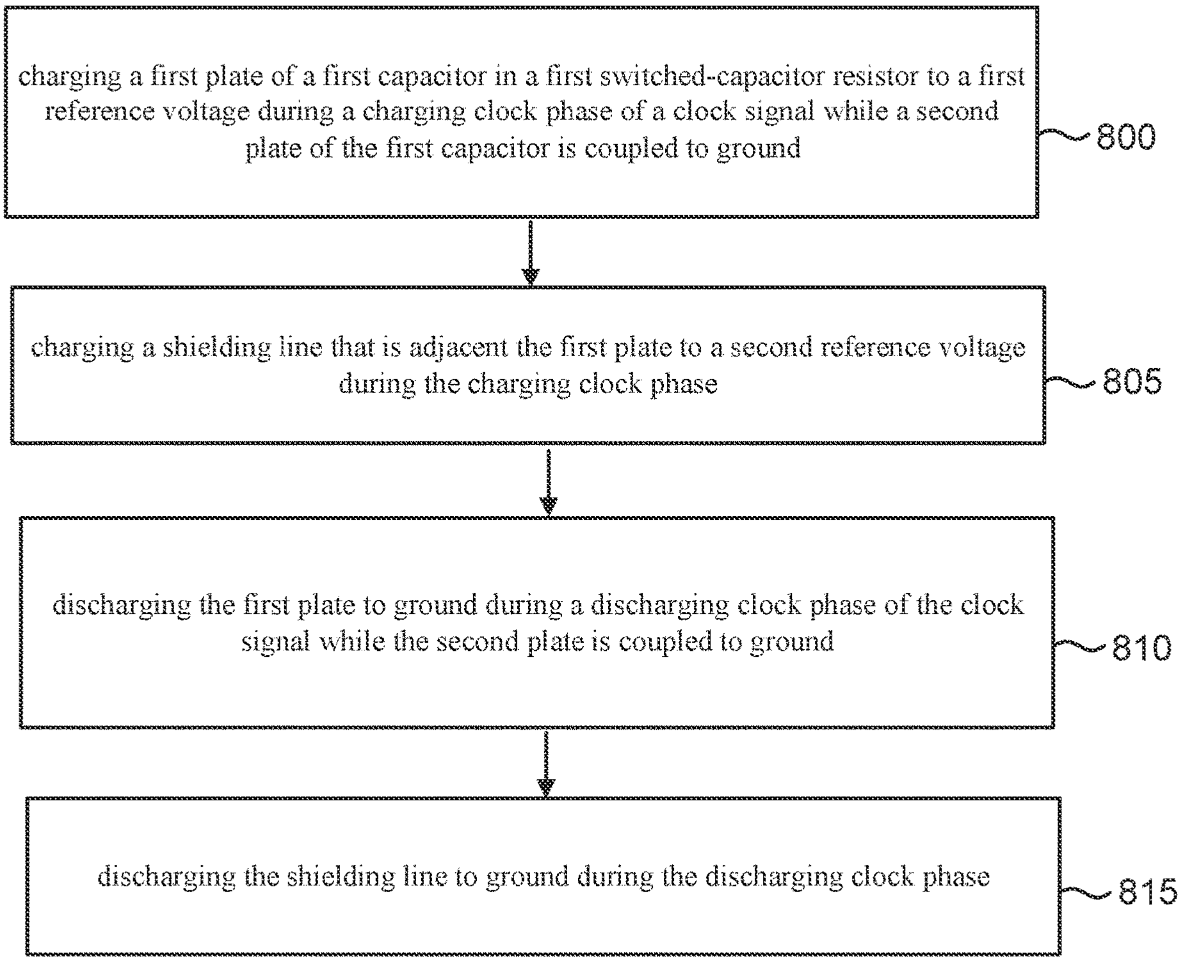
FIG. 8 is a flowchart for a method of operation of a stray-capacitance-insensitive switched-capacitor current source in accordance with an aspect of the disclosure.

An example method of operation for a stray-capacitance-insensitive switched-capacitor current source will now be discussed with reference to the flowchart of FIG. 8. The method includes an act 800 of charging a first plate of a first capacitor in a first switched-capacitor resistor to a first reference voltage during a charging clock phase of a clock signal while a second plate of the first capacitor is coupled to ground. The charging of the top plate of the charging capacitor of FIG. 6 is an example of act 800. The method also includes an act 805 of charging a shielding line that is adjacent the first plate to a second reference voltage during the charging clock phase. The charging of the shielding line 615 of FIG. 6 is an example of act 805. Note that the first and second reference voltages may be equal in some implementations and may differ in alternative implementations as discussed earlier. The method further includes an act 810 of discharging the first plate to ground during a discharging clock phase of the clock signal while the second plate is coupled to ground. The grounding of the top plate of the charging capacitor of FIG. 6 is an example of act 810. Finally, the method includes an act 815 of discharging the shielding line to ground during the discharging clock phase. The grounding of the shielding line 615 is an example of act 815.

Figure 9:
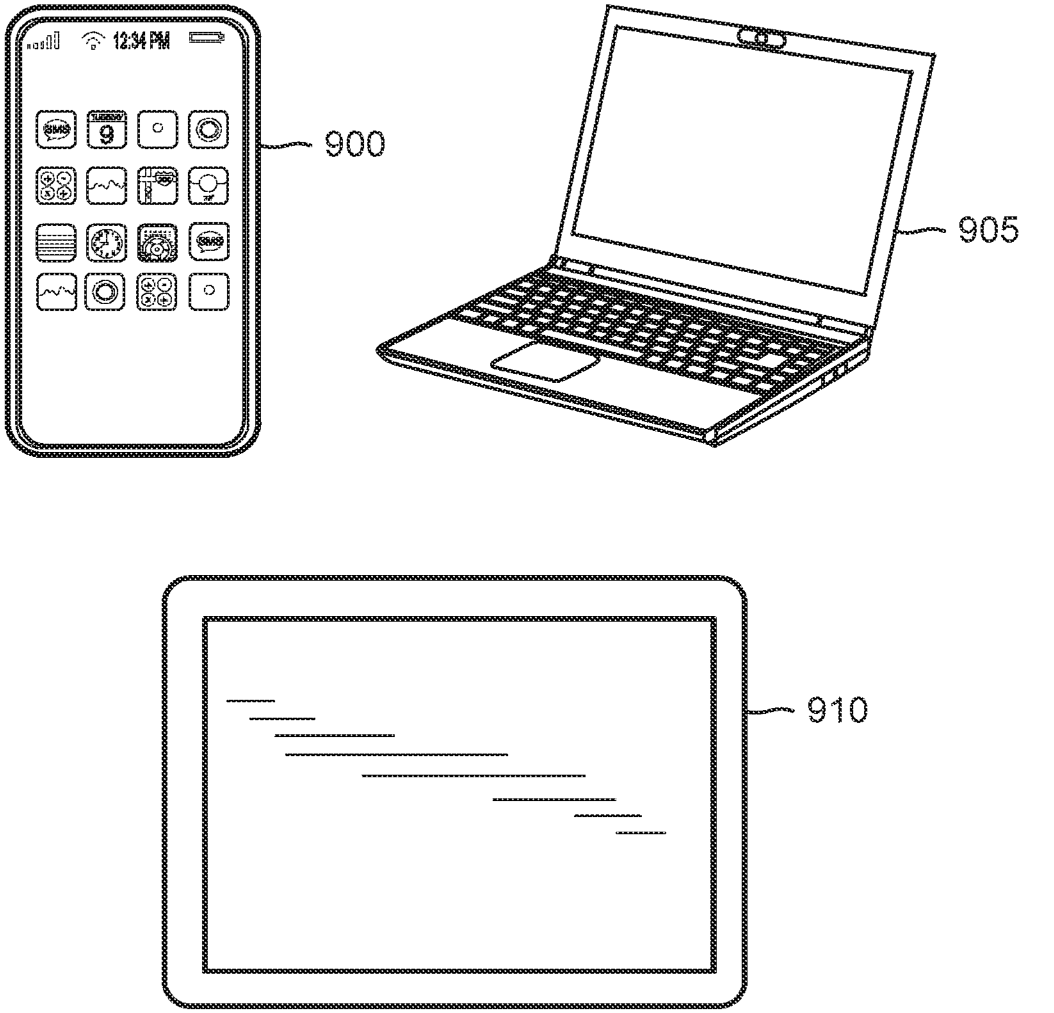
FIG. 9 illustrates some example electronic systems including a duty-cycle-insensitive and/or stray-capacitance-insensitive switched-capacitor current source in accordance with an aspect of the disclosure.

A duty-cycle-insensitive and/or a stray-capacitance-insensitive switched-capacitor current source as disclosed herein may be incorporated in a wide variety of electronic systems. For example, as shown in FIG. 9, a cellular telephone 900, a laptop computer 905, and a tablet PC 910 may all include an analog-to-digital converter that functions to process an audio signal from a microphone in which the switched-capacitor current source provides a bias current to the analog-to-digital converter in accordance with the disclosure. Other exemplary electronic systems such as an earbud, a music player, a video player, a communication device, and a personal computer may also be configured with a switched-capacitor current source constructed in accordance with the disclosure.

The disclosure will now be summarized through the following example clauses:

Clause 1. A switched-capacitor current source, comprising:
- a first transistor having a source coupled to a power supply node for a power supply voltage;
- a first switch coupled to a drain of the first transistor;
- a first switched-capacitor resistor including a first capacitor, the first switched-capacitor resistor being configured to couple a first plate of the first capacitor to the first switch during a charging clock phase of a first clock signal;

a second switch coupled to the drain of the first transistor; and a second switched-capacitor resistor including a second capacitor, the second switched-capacitor resistor being configured to couple a first plate of the second capacitor to the second switch during a charging clock phase of a second clock signal.

Clause 2. The switched-capacitor current source of clause 1, further comprising:

a diode-connected transistor having a source coupled to the power supply node and a gate coupled to a gate of the first transistor;

a second transistor having a source coupled to ground and a drain coupled to a drain of the diode-connected transistor; and a differential amplifier having an output terminal coupled to a gate of the second transistor.

Clause 3. The switched-capacitor current source of clause 2, wherein the differential amplifier includes a first input terminal for receiving a reference voltage and includes a second input terminal coupled to the output terminal.

Clause 4. The switched-capacitor current source of clause 3, wherein the second input terminal is coupled to the output terminal through a coupling capacitor.

Clause 5. The switched-capacitor current source of any of clauses 3-4, further comprising:

a third switch coupled between the first switched-capacitor resistor and the second input terminal; and a fourth switch coupled between the second switched-capacitor resistor and the second input terminal.

Clause 6. The switched-capacitor current source of any of clauses 3-5, wherein the first input terminal is a non-inverting input terminal, and wherein the second input terminal is an inverting input terminal.

Clause 7. The switched-capacitor current source of any of clauses 1-6, wherein the first switch is configured to close during the charging clock phase of the first clock signal, and wherein the second switch is configured to close during the charging clock phase of the second clock signal.

Clause 8. The switched-capacitor current source of any of clauses 1-7, wherein a capacitance of the first capacitor equals a capacitance of the second capacitor.

Clause 9. The switched-capacitor current source of clause 8, wherein the capacitance of the first capacitor is proportional to a capacitance of an integration capacitor in a continuous-time integration stage of an analog-to-digital converter.

Clause 10. The switched-capacitor current source of clause 9, wherein the analog-to-digital converter includes a tuning circuit including a variable tuning resistor configured to be charged by a mirrored version of a charging current conducted by the first transistor.

Clause 11. The switched-capacitor current source of clause 10, wherein the tuning circuit is configured to adjust a resistance of the variable tuning resistor responsive to a digital code based upon a comparison of a voltage across the variable tuning resistor and a reference voltage, and wherein the continuous-time integration stage includes a variable input resistor configured to be tuned responsive to the digital code.

Clause 12. The switched-capacitor current source of any of clauses 1-11, wherein the first clock signal and the second clock signal comprise a pair of complementary and non-overlapping clock signals.

Clause 13. The switched-capacitor current source of any of clauses 9-10, wherein the analog-to-digital converter is configured to convert an audio signal.

Clause 14. A method of sourcing a current from a switched-capacitor current source, comprising:

sourcing the current from a common node to charge a first capacitor in a first switched-capacitor resistor to a reference voltage during a first phase of a clock signal; and sourcing the current from the common node to charge a second capacitor in a second switched-capacitor resistor to the reference voltage during a second phase of the clock signal.

Clause 15. The method of clause 14, further comprising:

mirroring the current to form a bias current; and biasing an external circuit with the bias current, wherein the bias current is substantially insensitive to a duty cycle of the clock signal.

Clause 16. The method of clause 15, wherein biasing the external circuit comprises conducting the bias current through a variable tuning resistor to form a tuning voltage, the method further comprising:

comparing the tuning voltage to the reference voltage to form a comparator output signal;

adjusting a resistance of the variable tuning resistor according to a digital code that is responsive to comparator output signal; and adjusting a resistance of an input resistor in a continuous-time integration stage of an analog-to-digital converter responsive to the digital code.

Clause 17. A switched-capacitor current source, comprising:

a first switched-capacitor resistor including a first capacitor having a top plate configured to be charged to a first reference voltage during a charging clock phase of a first clock signal;

a first shielding line adjacent the top plate of the first capacitor;

a differential amplifier;

a first switch coupled between the first shielding line and an output terminal of the differential amplifier; and a second switch coupled between the first shielding line and ground.

Clause 18. The switched-capacitor current source of clause 17, wherein the differential amplifier is configured to charge the output terminal to a second reference voltage, and wherein the first switch is configured to close during the charging clock phase and to open during a discharging clock phase of the first clock signal, and wherein the second switch is configured to close during the discharging clock phase and to open during the charging clock phase.

Clause 19. The switched-capacitor current source of any of clauses 17-18, further comprising:

a second switched-capacitor resistor including a second capacitor having a top plate configured to be charged to the first reference voltage during a charging clock phase of a second clock signal;

a second shielding line positioned between the top plate of the second capacitor and the first shielding line;

a third switch coupled between the second shielding line and the output terminal of the differential amplifier; and a fourth switch coupled between the second shielding line and ground.

Clause 20. The switched-capacitor current source of clause 19, wherein a capacitance of the first capacitor equals a capacitance of the second capacitor, and wherein the first clock signal and the second clock signal comprise a pair of non-overlapping complementary clock signals.

As those of some skill in this art will by now appreciate and depending on the particular application at hand, many modifications, substitutions and variations can be made in and to the materials, apparatus, configurations and methods of use of the devices of the present disclosure without departing from the scope thereof as defined by the appended claims. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:

1. A switched-capacitor current source, comprising:

a first transistor having a source coupled to a power supply node for a power supply voltage;

a first switch coupled to a drain of the first transistor;

a first switched-capacitor resistor including a first capacitor, the first switched-capacitor resistor being configured to couple a first plate of the first capacitor to the first switch to charge the first capacitor with a current from the power supply node during a charging clock phase of a first clock signal, responsive to the charging clock phase of the first clock signal, wherein a second plate of the first capacitor is coupled to ground during the charging clock phase;

a second switch coupled to the drain of the first transistor;

a second switched-capacitor resistor including a second capacitor, the second switched-capacitor resistor being configured to couple a first plate of the second capacitor to the second switch to charge the second capacitor with the current from the power supply node during a charging clock phase of a second clock signal, responsive to the charging clock phase of the second clock signal, wherein a second plate of the second capacitor is coupled to ground during the charging clock phase; and a current mirror coupled to the first transistor and configured to mirror the current to form a bias current of the switched-capacitor current source.

2. The switched-capacitor current source of claim 1, further comprising:

a diode-connected transistor having a source coupled to the power supply node and a gate coupled to a gate of the first transistor;

a second transistor having a source coupled to ground and a drain coupled to a drain of the diode-connected transistor; and a differential amplifier having an output terminal coupled to a gate of the second transistor.

3. The switched-capacitor current source of claim 2, wherein the differential amplifier includes a first input terminal for receiving a reference voltage and includes a second input terminal coupled to the output terminal.

4. The switched-capacitor current source of claim 3, wherein the second input terminal is coupled to the output terminal through a coupling capacitor.

5. The switched-capacitor current source of claim 3, further comprising:

a third switch coupled between the first switched-capacitor resistor and the second input terminal; and a fourth switch coupled between the second switched-capacitor resistor and the second input terminal.

6. The switched-capacitor current source of claim 3, wherein the first input terminal is a non-inverting input terminal, and wherein the second input terminal is an inverting input terminal.

7. The switched-capacitor current source of claim 1, wherein the first switch is configured to close during the charging clock phase of the first clock signal, and wherein the second switch is configured to close during the charging clock phase of the second clock signal.

8. The switched-capacitor current source of claim 1, wherein a capacitance of the first capacitor equals a capacitance of the second capacitor.

9. The switched-capacitor current source of claim 8, wherein the capacitance of the first capacitor is proportional to a capacitance of an integration capacitor in a continuous-time integration stage of an analog-to-digital converter.

10. The switched-capacitor current source of claim 9, wherein the analog-to-digital converter includes a tuning circuit including a variable tuning resistor configured to be charged by a mirrored version of a charging current conducted by the first transistor.

11. The switched-capacitor current source of claim 10, wherein the tuning circuit is configured to adjust a resistance of the variable tuning resistor responsive to a digital code based upon a comparison of a voltage across the variable tuning resistor and a reference voltage, and wherein the continuous-time integration stage includes a variable input resistor configured to be tuned responsive to the digital code.

12. The switched-capacitor current source of claim 1, wherein the first clock signal and the second clock signal comprise a pair of complementary and non-overlapping clock signals.

13. The switched-capacitor current source of claim 9, wherein the analog-to-digital converter is configured to convert an audio signal.

14. A method of sourcing a current from a switched-capacitor current source, comprising:

sourcing the current from a common node to charge a first capacitor coupled between the common node and a ground in a first switched-capacitor resistor to a reference voltage during a first phase of a clock signal;

sourcing the current from the common node to charge a second capacitor coupled between the common node and a ground in a second switched-capacitor resistor to the reference voltage during a second phase of the clock signal; and mirroring the current to form a bias current of the switched-capacitor current source.

15. The method of claim 14, further comprising:

biasing an external circuit with the bias current, wherein the bias current is substantially insensitive to a duty cycle of the clock signal.

16. The method of claim 15, wherein biasing the external circuit comprises conducting the bias current through a variable tuning resistor to form a tuning voltage, the method further comprising:

comparing the tuning voltage to the reference voltage to form a comparator output signal;

adjusting a resistance of the variable tuning resistor according to a digital code that is responsive to comparator output signal; and adjusting a resistance of an input resistor in a continuous-time integration stage of an analog-to-digital converter responsive to the digital code.

17. A switched-capacitor current source, comprising:

a first switched-capacitor resistor including a first capacitor having a top plate configured to be charged to a first reference voltage during a charging clock phase of a first clock signal;

a first shielding line adjacent the top plate of the first capacitor between the top plate and grounded signal nodes of the switched-capacitor current source, wherein the first shielding line is configured to be charged during the charging clock phase of the first clock signal;

a differential amplifier;

a first switch coupled between the first shielding line and an output terminal of the differential amplifier; and a second switch coupled between the first shielding line and ground.

18. The switched-capacitor current source of claim 17, wherein the differential amplifier is configured to charge the output terminal to a second reference voltage, and wherein the first switch is configured to close during the charging clock phase and to open during a discharging clock phase of the first clock signal, and wherein the second switch is configured to close during the discharging clock phase and to open during the charging clock phase.

19. The switched-capacitor current source of claim 17, further comprising:

a second switched-capacitor resistor including a second capacitor having a top plate configured to be charged to the first reference voltage during a charging clock phase of a second clock signal;

a second shielding line positioned between the top plate of the second capacitor and the first shielding line;

a third switch coupled between the second shielding line and the output terminal of the differential amplifier; and a fourth switch coupled between the second shielding line and ground.

20. The switched-capacitor current source of claim 19, wherein a capacitance of the first capacitor equals a capacitance of the second capacitor, and wherein the first clock signal and the second clock signal comprise a pair of non-overlapping complementary clock signals.

21. A switched-capacitor current source, comprising:

a first transistor having a source coupled to a power supply node for a power supply voltage;

a first switch coupled to a drain of the first transistor;

a first switched-capacitor resistor including a first capacitor, wherein the capacitance of the first capacitor is proportional to a capacitance of an integration capacitor in a continuous-time integration stage of an analog-to-digital converter, the first switched-capacitor resistor being configured to couple a first plate of the first capacitor to the first switch to charge the first capacitor from the power supply node during a charging clock phase of a first clock signal, wherein a second plate of the first capacitor is coupled to ground during the charging clock phase;

a second switch coupled to the drain of the first transistor; and a second switched-capacitor resistor including a second capacitor, wherein a capacitance of the first capacitor equals a capacitance of the second capacitor, the second switched-capacitor resistor being configured to couple a first plate of the second capacitor to the second switch to charge the second capacitor from the power supply node during a charging clock phase of a second clock signal, wherein a second plate of the second capacitor is coupled to ground during the charging clock phase, wherein the analog-to-digital converter includes a tuning circuit including a variable tuning resistor configured to be charged by a mirrored version of a charging current conducted by the first transistor.

22. The switched-capacitor current source of claim 21, wherein the tuning circuit is configured to adjust a resistance of the variable tuning resistor responsive to a digital code based upon a comparison of a voltage across the variable tuning resistor and a reference voltage, and wherein the continuous-time integration stage includes a variable input resistor configured to be tuned responsive to the digital code.

* * * * *